United States Patent
Isobe et al.

(10) Patent No.: US 8,530,333 B2
(45) Date of Patent: Sep. 10, 2013

(54) SEMICONDUCTOR DEVICE AND MANUFACTURING METHOD THEREOF

(75) Inventors: Atsuo Isobe, Kanagawa (JP); Hiromichi Godo, Kanagawa (JP); Satoshi Shinohara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 620 days.

(21) Appl. No.: 12/721,298

(22) Filed: Mar. 10, 2010

(65) Prior Publication Data

US 2010/0230754 A1    Sep. 16, 2010

(30) Foreign Application Priority Data

Mar. 12, 2009  (JP) .................... 2009-059157

(51) Int. Cl.
 *H01L 21/46*    (2006.01)
(52) U.S. Cl.
 USPC .... 438/458; 438/164; 438/455; 257/E21.567; 257/E21.568
(58) Field of Classification Search
 USPC ............... 438/164, 455, 458; 257/E21.567, 257/E21.568
 See application file for complete search history.

(56) References Cited

U.S. PATENT DOCUMENTS

| | | | |
|---|---|---|---|
| 6,534,380 B1 | 3/2003 | Yamauchi et al. | |
| 7,119,365 B2 | 10/2006 | Takafuji et al. | |
| 7,294,881 B2 * | 11/2007 | Korenari et al. | 257/314 |
| 2003/0162346 A1 | 8/2003 | Srinivasan | |
| 2006/0084249 A1 | 4/2006 | Yamada | |
| 2007/0063281 A1 | 3/2007 | Takafuji et al. | |
| 2007/0141802 A1 | 6/2007 | Gadkaree | |
| 2007/0281399 A1 | 12/2007 | Cites et al. | |
| 2008/0136990 A1 | 6/2008 | Kimura | |
| 2008/0248629 A1 | 10/2008 | Yamazaki | |
| 2008/0311726 A1 | 12/2008 | Ohnuma et al. | |
| 2009/0004878 A1 * | 1/2009 | Ohnuma et al. | 438/759 |

FOREIGN PATENT DOCUMENTS

| | | |
|---|---|---|
| JP | 11-163363 A | 6/1999 |
| JP | 2008-225338 A | 9/2008 |

* cited by examiner

*Primary Examiner* — Matthew Landau
*Assistant Examiner* — Colleen E Snow
(74) *Attorney, Agent, or Firm* — Fish & Richardson P.C.

(57) ABSTRACT

An object is to provide a semiconductor device which solves a problem that can occur when a substrate having an insulating surface is used. The semiconductor device includes a base substrate having an insulating surface; a conductive layer over the insulating surface; an insulating layer over the conductive layer; a semiconductor layer having a channel formation region, a first impurity region, a second impurity region, and a third impurity region provided between the channel formation region and the second impurity region over the insulating layer; a gate insulating layer configured to cover the semiconductor layer; a gate electrode over the gate insulating layer; a first electrode electrically connected to the first impurity region; and a second electrode electrically connected to the second impurity region. The conductive layer is held at a given potential.

18 Claims, 9 Drawing Sheets

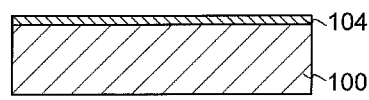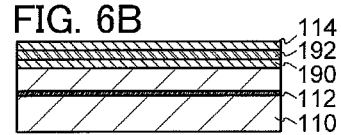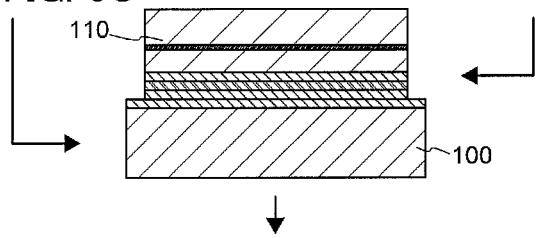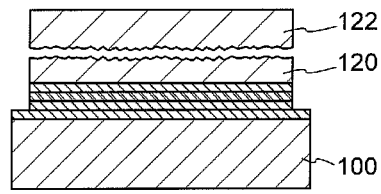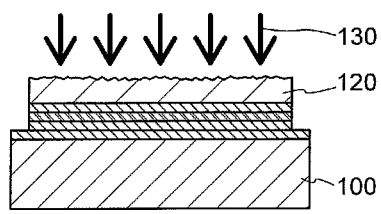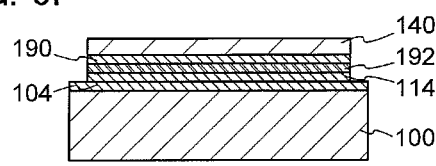

SEMICONDUCTOR DEVICE AND MANUFACTURING METHOD THEREOF

BACKGROUND OF THE INVENTION

1. Field of the Invention

The technical field of the present invention relates to a semiconductor device and a manufacturing method thereof.

2. Description of the Related Art

In recent years, instead of a bulk silicon wafer, integrated circuits using a silicon on insulator (SOI) substrate have been developed. By utilizing characteristics of a thin single crystal silicon layer formed over an insulating layer, transistors formed in the integrated circuit can be electrically separated from each other completely. Further, each transistor can be formed as a fully-depleted transistor, and thus a semiconductor integrated circuit with high added value such as high integration, high speed driving, and low power consumption can be realized. In the development of LSI using such an SOI substrate, improvement in the operating frequency and processing capability is realized by reducing the area of a chip by using a multilayer wiring technique.

Further, a method for forming a single crystal silicon layer over a supporting substrate made of glass by a Smart Cut (registered trademark) method has been proposed as a method for manufacturing such an SOI substrate (e.g., see Reference 1). Since a glass substrate can easily have a larger area and is less expensive than a silicon wafer, when a glass substrate is used as a base substrate, an inexpensive large-area SOI substrate can be manufactured.

[Reference]

Reference 1: Japanese Published Patent Application No. H11-163363

SUMMARY OF THE INVENTION

As described above, the case where a glass substrate is used as a base substrate has an advantage in that a semiconductor device can be provided at low cost by taking advantage of the characteristics of an inexpensive large-area substrate.

On the other hand, in the case where a glass substrate is used as a base substrate, a variety of problems may possibly be caused by the fact that the glass substrate is made of an insulating material. For example, when a stacked structure of a glass substrate, an insulating layer over the glass substrate, and a semiconductor layer over the insulating layer is used as a structure of an SOI substrate, the thickness of an insulating region below the semiconductor layer is the sum of the thickness of the insulating layer and the thickness of the glass substrate. Therefore, the thickness of the insulating region below the semiconductor layer is significantly larger than the thickness of the insulating layer which is formed on a silicon wafer. Accordingly, although a problem does not occur when a substrate of silicon or the like is used, the problem may possibly occur in the case where a glass substrate is used.

In view of the foregoing concerns, an object of one embodiment of the present invention disclosed in this specification and the like (at least including claims, specification, and drawings) is to provide a semiconductor device which solves problems that may possibly occur when a substrate having an insulating surface, such as a glass substrate, is used.

According to one embodiment of the present invention disclosed herein, a semiconductor device is formed using a substrate in which a conductive layer, an insulating layer, and a semiconductor layer are stacked over a substrate having an insulating surface.

For example, according to one embodiment of the present invention disclosed herein, a method for manufacturing a semiconductor device includes the steps of irradiating a bond substrate with an ion to form an embrittlement region in the bond substrate; forming a conductive layer on a surface of a base substrate having an insulating surface; attaching the bond substrate and the base substrate with an insulating layer interposed therebetween; heating the bond substrate and separating the bond substrate in the embrittlement region to form a stacked structure of the conductive layer, the insulating layer, and a semiconductor layer over the base substrate; patterning the semiconductor layer to form an island-shaped semiconductor layer; forming a gate insulating layer so as to cover the island-shaped semiconductor layer; forming a gate electrode over the gate insulating layer; selectively adding an impurity element to the island-shaped semiconductor layer to form a channel formation region, a first impurity region, a second impurity region, and a third impurity region between the channel formation region and the second impurity region; and forming a first electrode electrically connected to the first impurity region and a second electrode electrically connected to the second impurity region.

In addition, according to one embodiment of the present invention disclosed herein, a method for manufacturing a semiconductor device includes the steps of irradiating a bond substrate with an ion to form an embrittlement region in the bond substrate; forming a first insulating layer on a surface of the bond substrate; forming a conductive layer over the first insulating layer; forming a second insulating layer over the conductive layer; forming a third insulating layer on a surface of a base substrate having an insulating surface; attaching the bond substrate and the base substrate with the second insulating layer and the third insulating layer interposed therebetween; heating the bond substrate and separating the bond substrate in the embrittlement region to form a stacked structure of the third insulating layer, the second insulating layer, the conductive layer, the first insulating layer, and a semiconductor layer over the base substrate; patterning the semiconductor layer to form an island-shaped semiconductor layer; forming a gate insulating layer so as to cover the island-shaped semiconductor layer; forming a gate electrode over the gate insulating layer; selectively adding an impurity element to the island-shaped semiconductor layer to form a channel formation region, a first impurity region, a second impurity region, and a third impurity region between the channel formation region and the second impurity region; and forming a first electrode electrically connected to the first impurity region and a second electrode electrically connected to the second impurity region. Note that according to one embodiment, the ions may be added to the bond substrate to form the embrittlement region before the first insulating layer is formed on the surface of the bond substrate, after the first insulating layer is formed, after the conductive layer is formed, or after the second insulating layer is formed.

Note that in the above method, a protective insulating layer may be formed on the surface of the bond substrate before the embrittlement region is formed. Note that the bond substrate is preferably one of a single crystal silicon substrate and a single crystal silicon carbide substrate.

According to one embodiment of the present invention disclosed herein, a semiconductor device includes a base substrate having an insulating surface; a conductive layer over the insulating surface; an insulating layer over the conductive layer; a semiconductor layer over the insulating layer, the semiconductor layer having a channel formation region, a first impurity region, a second impurity region, and a third impurity region between the channel formation region and the second impurity region; a gate insulating layer covering the semiconductor layer; a gate electrode over the gate insulating layer; and a first electrode electrically connected to the first impurity region and a second electrode electrically connected to the second impurity region. The conductive layer is held at a given potential.

Note that in the above semiconductor device, the semiconductor layer is preferably one of a single crystal silicon layer and a single crystal silicon carbide layer. In addition, the given potential is preferably a ground potential.

In addition, in the above semiconductor device, an impurity concentration of each of the first impurity region and the second impurity region is preferably higher than or equal to $1 \times 10^{19}$ atoms/cm$^3$, and an impurity concentration of the third impurity region is preferably higher than or equal to $5 \times 10^{16}$ atoms/cm$^3$. Further, a thickness of the insulating layer is preferably less than or equal to 5 μm.

Note that in the above semiconductor device, the channel formation region may be electrically connected to the conductive layer.

According to one embodiment of the present invention disclosed in this specification and the like, even when a semiconductor device is manufactured using a substrate having an insulating surface, suppression the decrease in on-state current and improvement of drain withstand voltage can be compatible.

BRIEF DESCRIPTION OF THE DRAWINGS

FIGS. 6A to 6F are views illustrating a method for manufacturing a semiconductor substrate.

DETAILED DESCRIPTION OF THE INVENTION

Figure 1A:
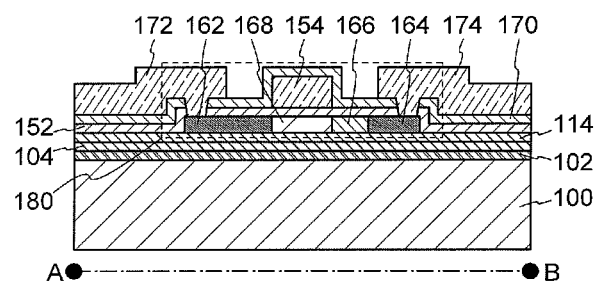
FIGS. 1A and 1B are views illustrating a semiconductor device.

Hereinafter, embodiments of the present invention will be described in detail with reference to the accompanying drawings. Note that the present invention is not limited to the description of the embodiments, and it is apparent to those skilled in the art that modes and details can be modified in various ways without departing from the spirit of the present invention disclosed in this specification and the like. In addition, the structures of any of the embodiments can be implemented in appropriate combination. Note that a common reference numeral refers to the same part or a part having a similar function throughout the drawings in the structure of the invention described below, and the description thereof is omitted.

(Embodiment 1)

In this embodiment, one example of a semiconductor device which is one embodiment of the present invention disclosed herein and a manufacturing method thereof will be described with reference to FIGS. 1A and 1B, FIGS. 2A and 2B, FIGS. 3A to 3F, FIGS. 4A to 4D, and FIGS. 5A to 5D. Specifically, a transistor which is one example of the semiconductor device is described with reference to FIGS. 1A and 1B and FIGS. 2A and 2B. A method for manufacturing a semiconductor substrate used for the semiconductor device is described with reference to FIGS. 3A to 3F. A method for manufacturing the transistor which is one example of the semiconductor device is described with reference to FIGS. 4A to 4D and FIGS. 5A to 5D. Note that the transistor which is described in this embodiment is preferably used as a transistor for high voltage and a large amount of current; however, the application of the present invention disclosed herein is not limited thereto.

Figure 1B:
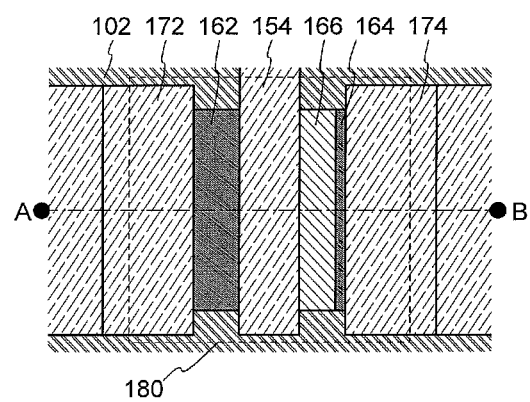

In FIGS. 1A and 1B, the transistor which is one example of the semiconductor device is illustrated. Here, FIG. 1A is a cross-sectional view, and FIG. 1B is a plan view. Note that FIG. 1A is a cross-sectional view taken along line A-B in FIG. 1B. In addition, in FIG. 1B, parts of components are omitted for simplicity.

A transistor 180 illustrated in FIGS. 1A and 1B is provided over a base substrate 100 having an insulating surface. Here, between the transistor 180 and the base substrate 100, a conductive layer 102, an insulating layer 104, and an insulating layer 114 are formed in that order from the base substrate 100 side.

The transistor 180 includes a gate electrode 154, a high concentration impurity region 162 (first impurity region), a high concentration impurity region 164 (second impurity region), a low concentration impurity region 166 (third impurity region), a channel formation region 168, an electrode 172, an electrode 174, and the like. The gate electrode 154 has a function of applying voltage to the channel formation region 168 through a gate insulating layer 152. Each of the high concentration impurity region 162, the high concentration impurity region 164, the low concentration impurity region 166, and the channel formation region 168 is formed using a semiconductor material. In terms of element characteristics, it is preferable to use a single crystal semiconductor. In addition, an impurity element imparting one conductivity type is added to the high concentration impurity region 162, the high concentration impurity region 164, and the low concentration impurity region 166. Note that the impurity concentration in the high concentration impurity regions and the low concentration impurity region is set to given impurity concentration; however, it is preferable that, in order to keep the on-state current of the transistor 180 constant, an impurity element be added to the low concentration impurity region 166 at certain concentration.

In addition, an impurity element may be added to the channel formation region. For example, an impurity element which imparts conductivity that is opposite to the conductivity of the impurity element which is added to the high concentration impurity regions and the low concentration impurity region can be added. Needless to say, an impurity element which imparts the same conductivity as that of the impurity element which is added to the high concentration impurity regions and the low concentration impurity region may be added, if necessary.

The high concentration impurity region 162 (first impurity region) is adjacent to the channel formation region 168. The channel formation region 168 is adjacent to the low concentration impurity region 166. The low concentration impurity region 166 is adjacent to the high concentration impurity region 164. Further, the high concentration impurity region 162 is electrically connected to the electrode 172, and the high concentration impurity region 164 is electrically connected to the electrode 174. Here, although the low concentration impurity region can be provided between the channel formation region 168 and the high concentration impurity region 162, in order to obtain the on-state current stably, it is preferable that the low concentration impurity region be provided only on the high concentration impurity region (functioning as a drain) side.

Note that although the term "electrode" is used in the above, there is the case where an electrode is part of a wiring, so that a distinction between the electrode and the wiring is for convenience. In this manner, there is the case where an electrode and a wiring indicate the same component, it is not necessary to construe the electrode or the wiring with the limitation of these terms.

The high concentration impurity region 162 functions as a source region of the transistor 180, and the electrode 172 functions as a source electrode of the transistor 180. In addition, the high concentration impurity region 164 functions as a drain region of the transistor 180, and the electrode 174 functions as a drain electrode of the transistor 180. The low concentration impurity region 166 provided between the high concentration impurity region 164 and the channel formation region 168 has a function of reducing an electric field applied between the high concentration impurity region 164 and the channel formation region 168. In this manner, the transistor 180 is provided with the low concentration impurity region 166, so that avalanche breakdown caused by impact ionization can be suppressed and drain withstand voltage can be improved.

Further, in one embodiment of the present invention disclosed herein, the conductive layer 102 is provided below the transistor 180. Accordingly, an electric field in the low concentration impurity region 166 can be more favorably reduced. Note that the conductive layer 102 is preferably kept at a predetermined potential. This is because, when the conductive layer 102 is in a floating state, characteristics of the transistor might be changed by voltage applied to the transistor 180, or the like. Examples of the predetermined potential include a ground potential.

Figure 2A:
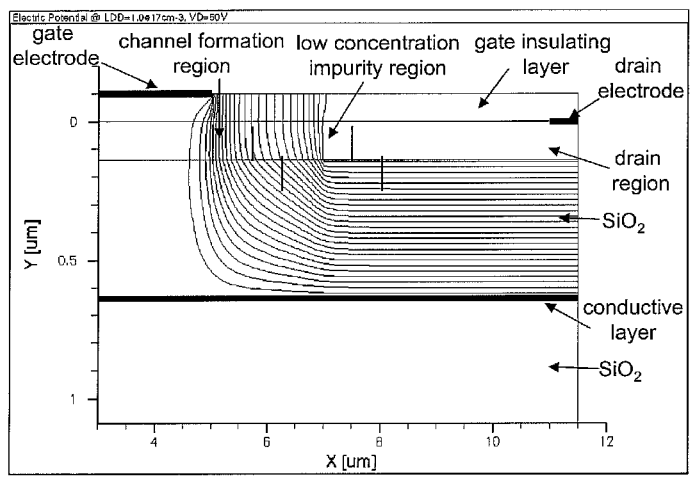
FIGS. 2A and 2B are diagrams each illustrating computer calculation results.
Figure 2B:
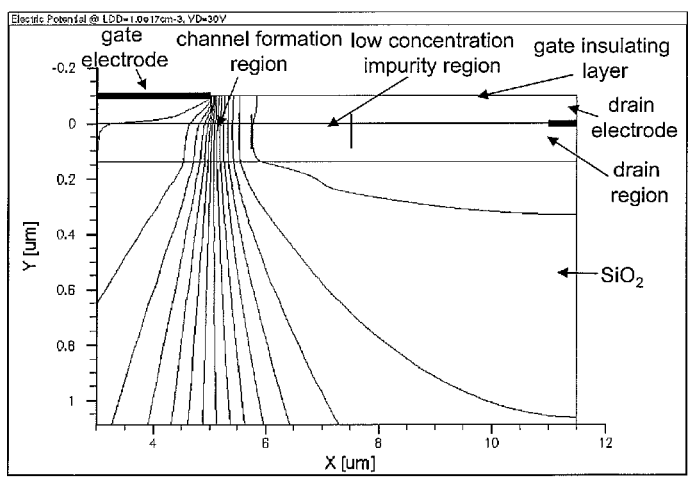

Here, verification results of effects by computer calculation are illustrated in FIGS. 2A and 2B. As software, a Sentaurus device (made by Synopsys, Inc.) which is a two dimensional device simulator was used. In addition, as a generation-recombination models, an SRH model and a Bologna impact ionization model were used. As a transistor, an n-channel transistor formed using single crystal silicon was assumed. The thickness of single crystal silicon was set to 140 nm. The thickness of a gate insulating layer was set to 100 nm. The channel length (length in a carrier movement direction in a channel formation region) was set to 10 μm. The channel width (length in a direction perpendicular to the carrier movement direction in the channel formation region) was set to 8 μm. The length of a low concentration impurity region (length in the carrier movement direction) was set to 2 μm. The impurity concentration of the low concentration impurity region was set to $1\times10^{17}$ atoms/cm$^3$. The impurity concentration of a high concentration impurity region (drain region) was set to $1\times10^{20}$ atoms/cm$^3$.

FIG. 2A illustrates equipotential lines in the case where a 0.5-μm-thick insulating layer (silicon oxide: SiO$_2$) is provided below a single crystal silicon layer, a conductive layer is provided below the insulating layer, a base substrate (silicon oxide: SiO$_2$) is provided below the conductive layer, and a drain voltage is 50V. FIG. 2B illustrates equipotential lines in the case where only silicon oxide having a thickness of 700 μm is used below a single crystal silicon layer and a drain voltage is 30V. In FIGS. 2A and 2B, the equipotential lines are illustrated at intervals of 2 V.

In FIG. 2B, calculation results of the case where only the 700-μm-thick silicon oxide layer is provided are illustrated. This is because the base substrate (silicon oxide) and the insulating layer (silicon oxide) are collectively considered as one layer. Note that in FIG. 2A, the potential of the conductive layer was set to a ground potential (0 V). In addition, in FIG. 2B, the potential of the silicon oxide layer on the rear surface side was set to a ground potential (0V). That is, the case where the potential of the rear surface of the base substrate was a ground potential was assumed. Note that in this embodiment, the rear surface side refers to a surface opposite to the surface on a side provided with the single crystal silicon layer.

The results show that, when the conductive layer is provided below the single crystal silicon layer (see FIG. 2A), the intervals between the equipotential lines are substantially equal near a region where the channel formation region and the low concentration impurity region are bonded to each other and near a region where the low concentration impurity region and the high concentration impurity region are bonded to each other, and that an electric field is reduced. On the other hand, it is found that, when the conductive layer is not provided below the single crystal silicon layer (see FIG. 2B), the equipotential lines are concentrated near a region where the channel formation region and the low concentration impurity region are bonded to each other and that an electric field is concentrated on the periphery of the bonding region. Therefore, in spite of a difference between the drain voltage in FIG. 2A and the drain voltage in FIG. 2B by 20 V, the electric fields near the region where the channel formation region and the low concentration impurity region are bonded to each other in FIGS. 2A and 2B are substantially the same.

As illustrated in FIG. 2B, in the case where the electric field is concentrated on the periphery of one bonding region (in this case, the region where the channel formation region and the low concentration impurity region are bonded to each other), impact ionization might occur even when the level of the drain voltage is low. That is, the drain withstand voltage decreases. Accordingly, as illustrated in FIG. 2A, when the conductive layer is provided below the semiconductor layer, the electric field at the periphery of the bonding region is reduced, and the drain withstand voltage can be improved.

As described above, when the conductive layer 102 is provided between the base substrate 100 and the insulating layer 104, the concentration of an electric field can be reduced and the drain withstand voltage of the transistor 180 can be further improved.

Note that when the impurity concentration in the low concentration impurity region is made low (for example, in the case where the impurity concentration is less than $1\times10^{16}$ atoms/cm$^3$), a region having a relatively low conductive property is formed between the channel formation region and the high concentration impurity region; therefore, the concentration of the electric field can be reduced even when the conductive layer is not formed. However, when the impurity concentration in the low concentration impurity region is made low in this manner, resistance when a transistor is operated increases, so that the amount of on-state current decreases.

In one embodiment of the present invention disclosed in this specification and the like, when the conductive layer 102 is provided between the base substrate 100 and the insulating layer 104, the drain withstand voltage can be improved without a decrease in the impurity concentration in the low concentration impurity region. That is, the problem of ensuring compatibility between suppression the decrease in the on-state current and improvement of the drain withstand voltage, which occurs when a substrate having an insulating surface is used as the base substrate, can be solved. Note that in order to suppress the decrease in the on-state current, the impurity concentration in the low concentration impurity region may be higher than or equal to $5 \times 10^{16}$ atoms/cm$^3$, for example.

Next, a method for manufacturing a semiconductor substrate used for a semiconductor device is described with reference to FIGS. 3A to 3F.

Figure 3A:
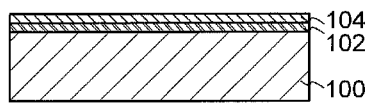
FIGS. 3A to 3F are views illustrating a method for manufacturing a semiconductor substrate.

First, the base substrate 100 is prepared (see FIG. 3A). As the base substrate 100, a light-transmitting glass substrate which can be used for a liquid crystal display device or the like can be used. As a glass substrate, a substrate having a strain point of higher than or equal to 580° C. and lower than or equal to 750° C. (preferably, higher than or equal to 600° C.) may be used. Needless to say, a glass substrate is not limited thereto as long as the glass substrate can withstand heat. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that, as the base substrate 100, as well as the glass substrate, a substrate which is formed with an insulator, such as a ceramic substrate, a quartz substrate, or a sapphire substrate; a substrate which is formed with a semiconductor such as silicon; a substrate which is formed with a conductor such as a metal or stainless steel; or the like can be used. Note that when a substrate which is not an insulator is used, the substrate preferably has an insulating surface. Specifically, for example, it is preferable to use a substrate in which an insulating layer is formed on an outermost surface and the thickness of the insulating layer is larger than 5 μm. In the case where such a substrate having the insulating surface is used, the effect of improvement in the drain withstand voltage due to the provision of the conductive layer can be obtained more effectively. Note that when the insulating layer on the outermost surface is thin, the substrate itself has a function which is similar to the conductive layer. That is, it can also be said that the effect with the use of the conductive layer is unique to an insulating substrate, a semiconductor substrate provided with an insulating layer having certain thickness on the outermost surface, or a conductive substrate provided with an insulating layer having certain thickness on the outermost surface. Note that in this specification and the like, as a concept including all of the substrates, a term such as "a substrate having an insulating surface" is used.

The conductive layer 102 is formed over the base substrate 100 (see FIG. 3A). A method for forming the conductive layer 102 is not particularly limited to a certain method, and for example, a sputtering method, a vacuum evaporation method, or the like can be used. The conductive layer 102 can be formed using a metal selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), niobium (Nb), chromium (Cr), and cerium (Ce); an alloy containing any of these metals as its main component; or nitride containing any of these metals as a component. The conductive layer 102 may be formed using conductive oxide such as indium tin oxide (ITO), indium tin oxide containing silicon oxide (ITSO), zinc oxide (ZnO); silicon to which an impurity element imparting conductivity is added; or the like. Note that the conductive layer 102 may have a single-layer structure or a stacked structure.

Then, the insulating layer 104 is formed over the conductive layer 102 (see FIG. 3A). A method for manufacturing the insulating layer 104 is not particularly limited to a certain method, and for example, a sputtering method, a plasma-enhanced CVD method, or the like can be used. The insulating layer 104 is a layer having a surface which is used for attachment; therefore, the surface preferably has high planarity. The insulating layer 104 can be formed using one or more materials selected from silicon oxide, silicon nitride, silicon oxynitride, silicon nitride oxide, aluminum oxide, aluminum nitride, aluminum oxynitride, aluminum nitride oxide, and the like. For example, in the case where the insulating layer 104 is formed using silicon oxide by a chemical vapor deposition method with the use of an organosilane gas, the insulating layer 104 which is extremely superior in planarity can be obtained. Note that the insulating layer 104 may have a single-layer structure or a stacked structure.

Note that in this specification and the like, oxynitride refers to a substance that contains more oxygen (atoms) than nitrogen (atoms). For example, silicon oxynitride is a substance including oxygen, nitrogen, silicon, and hydrogen at concentrations ranging from 50 to 70 at. %, 0.5 to 15 at. %, 25 to 35 at. %, and 0.1 to 10 at. %, respectively. Nitride oxide refers to a substance that contains more nitrogen (atoms) than oxygen (atoms). For example, silicon nitride oxide is a substance including oxygen, nitrogen, silicon, and hydrogen at concentrations ranging from 5 to 30 at. %, 20 to 55 at. %, 25 to 35 at. %, and 10 to 25 at. %, respectively. Note that the ranges are obtained by using Rutherford backscattering spectrometry (RBS) or hydrogen forward scattering spectrometry (HFS). Moreover, the total for the content ratio of the constituent elements does not exceed 100 at. %.

Figure 3B:
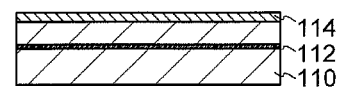

Next, a bond substrate 110 is prepared (see FIG. 3B). A semiconductor substrate formed of a Group 14 element such as silicon, germanium, silicon germanium, or silicon carbide can be used as the bond substrate 110. Needless to say, a substrate formed from a compound semiconductor such as gallium arsenide or indium phosphide may be used. As the bond substrate 110, a single crystal semiconductor substrate is preferably used; however, a polycrystal semiconductor substrate or other semiconductor substrates may be used. In this embodiment, a single crystal silicon substrate is used as the bond substrate 110. Although there is no limit on the size of the bond substrate 110, for example, a semiconductor substrate having a diameter of 8 inches (200 mm), 12 inches (300 mm), 18 inches (450 mm), or the like can be used. Alternatively, a round semiconductor substrate may be processed into a rectangular shape to be used. In this specification and the like, the "single crystal" means a crystal whose crystal structure has certain regularity and in which the crystal axes are oriented in the same direction in any portion. Note that it is not a matter of how many defects there are.

Ions are added to the bond substrate 110, so that an embrittlement region 112 is formed (see FIG. 3B). Specifically, for example, an ion beam including ions accelerated by an electric field is delivered to form the embrittlement region 112 at a predetermined depth from a surface of the bond substrate 110. The depth of the region where the embrittlement region 112 is formed can be controlled by the accelerating energy of the ion beam and the incidence angle thereof. Note that the embrittlement region 112 is formed in a region at a depth the same or substantially the same as the average penetration depth of the ions.

Depending on the depth at which the embrittlement region 112 is formed, the thickness of the semiconductor layer which is separated from the bond substrate 110 is determined. The depth at which the embrittlement region 112 is formed is greater than or equal to 50 nm and less than or equal to 1 μm from the surface of the bond substrate 110, and is preferably greater than or equal to 50 nm and less than or equal to 300 nm.

When ions are irradiated with the bond substrate 110, an ion implantation apparatus or an ion doping apparatus can be used. In an ion implantation apparatus, a source gas is excited to generate ion species, the generated ion species are mass-separated, and an object to be processed is irradiated with the ion species having a predetermined mass. In an ion doping apparatus, a process gas is excited to generate ion species, the generated ion species are not mass-separated, and an object to be processed is irradiated with the generated ion species. Note that in the ion doping apparatus provided with a mass separator, ion irradiation with mass separation can also be performed as in the ion implantation apparatus.

In the case of using an ion doping apparatus, a process for forming the embrittlement region 112 can be performed, for example, under the following conditions:

Accelerating voltage: greater than or equal to 10 kV and less than or equal to 100 kV (preferably greater than or equal to 30 kV and less than or equal to 80 kV)

Dose: higher than or equal to $1\times10^{16}$/cm$^2$ and lower than or equal to $4\times10^{16}$/cm$^2$ Beam current intensity: greater than or equal to 2 μA/cm$^2$ (preferably greater than or equal to 5 μA/cm$^2$, more preferably greater than or equal to 10 μA/cm$^2$).

In the case of using an ion doping apparatus, a gas containing hydrogen can be used as a source gas. By using the gas, $H^+$, $H_2^+$, and $H_3^+$ can be produced as ion species. In the case of using a hydrogen gas as a source gas, it is preferable to perform irradiation with a large amount of $H_3^+$. Specifically, it is preferable that the ion beam contains $H_3^+$ ions at a proportion of 70% or higher with respect to the total number of $H^+$, $H_2^+$, and $H_3^+$ ions. It is more preferable that the proportion of $H_3^+$ ions be greater than or equal to 80%. By increasing the proportion of $H_3^+$ ions in this manner, the embrittlement region 112 can contain hydrogen at a concentration of higher than or equal to $1\times10^{20}$ atoms/cm$^3$. Accordingly, separation at the embrittlement region 112 can be easily performed. By addition of a larger amount of $H_3^+$ ions, the embrittlement region 112 can be formed in a shorter period of time as compared to the case of addition of $H^+$ ions and $H_2^+$ ions. Moreover, with the use of $H_3^+$, the average penetration depth of ions can be made shallower; thus, the embrittlement region 112 can be formed at a shallower region.

In the case of using an ion implantation apparatus, it is preferable to perform mass separation to emit $H_3^+$ ions. Needless to say, irradiation with $H^+$ ions and $H_2^+$ ions may be performed as well. Note that, since ion species are selected to perform irradiation in the case of using an ion implantation apparatus, ion irradiation efficiency decreases compared to the case of using an ion doping apparatus, in some cases.

As a source gas for the ion addition step, as well as a gas containing hydrogen, one or more kinds of gases selected from a noble gas such as helium or argon; a halogen gas typified by a fluorine gas or a chlorine gas; or a halogen compound gas such as a fluorine compound gas (e.g., $BF_3$) can be used. When helium is used for a source gas, an ion beam with high proportion of $He^+$ ions can be formed without mass separation. By using such ion beams, the embrittlement region 112 can be formed efficiently.

Further, an ion addition step may be performed plural times to form the embrittlement region 112. In this case, different source gases may be used for ion irradiation or the same source gas may be used for the ion irradiation. For example, ion irradiation can be performed using a gas containing hydrogen as a source gas after ion irradiation is performed using a noble gas as a source gas. Alternatively, ion irradiation may be performed first using a halogen gas or a halogen compound gas, and then ion irradiation may be performed using a gas containing hydrogen.

Note that before the ion addition step, an insulating layer which functions as a protective insulating layer may be formed on the surface of the bond substrate 110. Needless to say, it is also possible that the insulating layer is not provided; however, the insulating layer is preferably provided in order to prevent contamination and surface damage of the bond substrate 110 due to later ion irradiation. The thickness of the insulating layer is preferably greater than or equal to b 10 nm and less than or equal to 400 nm. The description regarding the insulating layer 104 may be referred to for the formation method, material, structure, and the like of the insulating layer. The insulating layer may be removed or may remain after the ion addition step.

The insulating layer 114 is formed over the bond substrate 110 (see FIG. 3B). The description regarding the insulating layer 104 may be referred to for the formation method, material, structure, and the like of the insulating layer 114. Note that the insulating layer 104 is not necessarily the same as the insulating layer 114.

Note that in this embodiment, the case in which the insulating layer 104 is formed on the base substrate 100 side and the insulating layer 114 is formed on the bond substrate 110 side is described; however, one embodiment of the present invention disclosed herein is not limited thereto. As long as the structure in which at least the surface of the bond substrate 110 and the surface of the conductive layer 102 are not in direct contact with each other is used at the time of attachment, the structures of these insulating layers are not particularly limited to certain structures. For example, the insulating layer may be provided only on the base substrate 100 side or only on the bond substrate 110 side.

The insulating layer is preferably not too thick in order that one embodiment of the present invention disclosed herein is made more effective. This is because the effect due to the conductive layer 102 is reduced when the insulating layer is too thick. Note that the thickness of the insulating layer has a meaning which is similar to an interval between the semiconductor layer to be formed later and the conductive layer 102. For example, the insulating layer is preferably formed so that the interval between the semiconductor layer and the conductive layer 102 be less than or equal to 5 μm.

Note that the ion addition step (step of forming the embrittlement region 112) may be performed before or after the insulating layer 114 is formed.

Figure 3C:
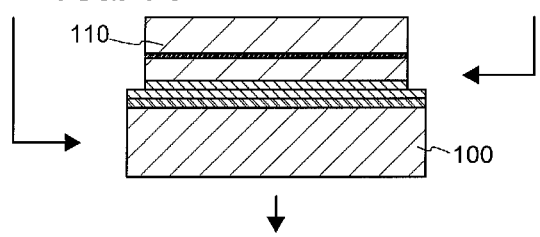

After that, the base substrate 100 and the bond substrate 110 are attached to each other (see FIG. 3C). Specifically, the base substrate 100 and the bond substrate 110 are attached to each other with the insulating layer 104 and the insulating layer 114 interposed therebetween. Note that the surfaces of the insulating layer 104 and the insulating layer 114 which are used for attachment are preferably cleaned by an ultrasonic cleaning method or the like. After the surface of the insulating layer 104 is in contact with the surface of the insulating layer 114, pressure treatment is performed, so that the base substrate 100 and the bond substrate 110 are attached to each other. As attachment mechanism, mechanism relating to van der Waals' force, mechanism relating to hydrogen bonding, or the like is conceivable.

Note that the surface which is used for the attachment may be subjected to oxygen plasma treatment or ozone treatment so that the surface may be hydrophilic. By this treatment, a hydroxyl is added to the attachment surface, so that a hydrogen bond can be formed at an attachment interface.

After the attachment, heat treatment may be performed on the base substrate 100 and the bond substrate 110 which are attached to each other so as to strengthen the attachment. The heat temperature at this time is preferably a temperature that does not promote separation at the embrittlement region 112. For example, the temperature is set to lower than 400° C., preferably lower than or equal to 300° C. Heat treatment time is not particularly limited and may be optimally set as appropriate depending on the relation between processing time and attachment strength. For example, heat treatment can be performed at 200° C. for 2 hours. Note that only the region which is used for the attachment can be locally heated by being irradiated with microwaves or the like. When the substrates have no attachment strength problems, the heat treatment may be omitted.

Figure 3D:
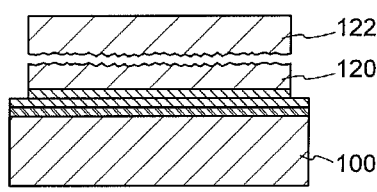

Next, the bond substrate 110 is separated into a semiconductor layer 120 and a semiconductor substrate 122 at the embrittlement region 112 (see FIG. 3D). The separation of the bond substrate 110 is performed by heat treatment. The temperature for the heat treatment can be set based on the upper temperature limit of the base substrate 100. In the case of using a glass substrate as the base substrate 100, for example, heat treatment temperature is preferably set to be higher than or equal to 400° C. and lower than or equal to 750° C. However, a glass substrate is not limited thereto as long as the glass substrate can withstand heat. Note that in this embodiment, the heat treatment is performed at 600° C. for two hours.

By performing the heat treatment, the volume of microvoids formed in the embrittlement region 112 is changed, and a crack is generated in the embrittlement region 112. As a result, the bond substrate 110 is separated along the embrittlement region 112. Accordingly, the semiconductor layer 120 separated from the bond substrate 110 is left over the base substrate 100. Further, since the interface which is used for the attachment is heated by this heat treatment, a covalent bond is formed at the interface, so that the attachment can be further strengthened.

In the structural body (hereinafter simply referred to as a "semiconductor substrate") formed as described above, defects due to the separation step or the ion addition step exist on the surface of the semiconductor layer 120, and planarity of the surface is impaired. Therefore, treatment for reducing defects in the semiconductor layer 120 or treatment for improving planarity of the surface of the semiconductor layer 120 is performed.

Figure 3E:
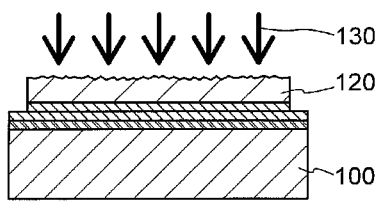

In this embodiment, reduction in defects and improvement in planarity of the semiconductor layer 120 can be realized in such a way that the semiconductor layer 120 is irradiated with a laser beam 130 (see FIG. 3E). The semiconductor layer 120 is irradiated with the laser beam 130, so that the semiconductor layer 120 is melted and then cooled to be solidified, whereby a semiconductor layer in which defects are reduced and surface planarity is improved can be obtained. In this embodiment, since the laser beam 130 is used, the base substrate 100 is not directly heated. That is, the temperature increase of the base substrate 100 can be suppressed. Therefore, a low-heat-resistant substrate such as a glass substrate can be used as the base substrate 100. Needless to say, heat treatment may be performed at a temperature in the range of the upper temperature limit of the base substrate. By heating the base substrate, reduction in defects can be effectively promoted even in the case where a laser beam with a relatively low energy density is used.

Note that it is preferable that the semiconductor layer 120 be partially melted by irradiation with the laser beam 130. This is because, if the semiconductor layer 120 is completely melted, it is highly likely to be microcrystallized due to random nucleation after being changed into a liquid phase. On the other hand, in the case of partial melting, crystal is grown from a solid phase portion which is not melted. Accordingly, defects in the semiconductor layer can be reduced while predetermined crystallinity is kept. Note that entire melting here means that the semiconductor layer 120 is melted to the vicinity of the lower interface to be made in a liquid phase. On the other hand, partial melting in this case means that the upper part of the semiconductor layer 120 is melted to be in a liquid phase while the lower part thereof is not melted and is still in a solid phase.

For the laser irradiation, a pulsed laser beam is preferably used. This is because a pulsed laser beam having high energy can be emitted instantaneously and a partially melting state can be easily formed. The repetition rate is preferably about greater than or equal to 1 Hz and less than or equal to 10 MHz, more preferably greater than or equal to 10 Hz and less than or equal to 1 MHz. As the pulsed laser, an Ar laser, a Kr laser, an excimer (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, a gold vapor laser, or the like can be used. Note that although it is preferable that a pulsed laser beam be used for partial melting, this embodiment is not necessarily limited thereto. That is, usage of a continuous wave laser is not excluded. Examples of the continuous-wave laser include an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like.

It is necessary that the wavelength of the laser beam 130 be set to a wavelength which can be absorbed by the semiconductor layer 120. A specific wavelength may be determined in consideration of the skin depth of the laser beam and the like. For example, when the semiconductor layer 120 is single crystal silicon, the laser beam 130 having a wavelength of greater than or equal to 250 nm and less than or equal to 700 nm may be used. Further, the energy density of the laser beam 130 can be determined in consideration of the wavelength of the laser beam 130, the skin depth of the laser beam 130, the thickness of the semiconductor layer 120, or the like. Specifically, for example, the energy density of the laser beam 130 may be in the range of greater than or equal to 300 $mJ/cm^2$ and less than or equal to 800 $mJ/cm^2$. Note that the energy density range is an example in the case where a XeCl excimer laser (wavelength: 308 nm) is used as a pulsed laser.

The irradiation with the laser beam 130 can be performed in an atmosphere containing oxygen such as an air atmosphere or an inert atmosphere such as a nitrogen atmosphere. In order to perform irradiation with the laser beam 130 in an inert atmosphere, the irradiation with the laser beam 130 may be performed in an airtight chamber while the atmosphere in the chamber may be controlled. In the case of not using the chamber, a nitrogen atmosphere can be formed by blowing an inert gas such as a nitrogen gas to the surface which is irradiated with the laser beam 130.

Note that the inert atmosphere such as nitrogen has higher effect of improving planarity of the semiconductor layer 120 than the air atmosphere. In addition, in the inert atmosphere, generation of cracks and ridges can be suppressed more effectively than in the air atmosphere, and the applicable energy density range for the laser beam 130 is widened. The irradiation with the laser beam 130 may be performed in vacuum. In the case where the irradiation with the laser beam 130 is performed in vacuum, the same effect can be obtained as that produced in the case where the irradiation with the laser beam 130 is performed in an inert atmosphere.

After the irradiation with the laser beam 130 is performed as described above, a step of thinning the semiconductor layer may be performed. In order to thin the semiconductor layer, one of a dry etching process or a wet etching process or a combination of both the etching processes may be performed. For example, in the case where the semiconductor layer is formed from silicon, the semiconductor layer can be thinned by a dry etching process using $SF_6$ and $O_2$ as process gases.

Note that the timing of etching treatment is not necessarily limited to the above. For example, etching treatment may be performed before irradiation with the laser beam. In this case, the unevenness or defects of the surface of the semiconductor layer can be reduced to some extent by the etching treatment. Alternatively, the treatment may be performed before and after laser beam irradiation. Further alternatively, the laser irradiation and the etching treatment may be alternately repeated. By using laser beam irradiation and etching treatment in combination as described above, unevenness, defects, and the like of the surface of the semiconductor layer can be effectively reduced. It is needless to say that the etching treatment, the heat treatment, and the like need not always be used. If reduction in defects and improvement in planarity of the semiconductor layer 120 are not necessary, the irradiation treatment with a laser beam can be omitted.

Figure 3F:
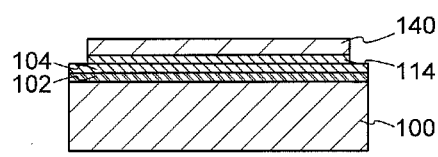

Accordingly, the semiconductor substrate having the conductive layer 102 can be formed below a semiconductor layer 140 (see FIG. 3F).

Next, a method for manufacturing a semiconductor device formed using the semiconductor substrate is described with reference to FIGS. 4A to 4D and FIGS. 5A to 5D. Here, a method for manufacturing a semiconductor device including a transistor which is used for high voltage, a large amount of current, and the like is described as an example.

Figure 4A:
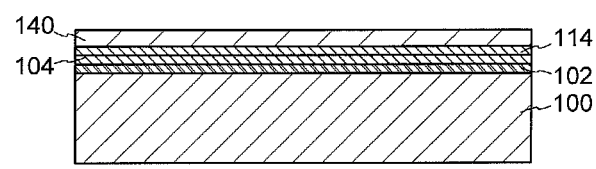
FIGS. 4A to 4D are views illustrating a method for manufacturing a semiconductor device.

FIG. 4A corresponds to an enlarged cross-sectional view of part of the semiconductor substrate. As will be noted from FIG. 4A, the conductive layer 102 is provided between the base substrate 100 and the insulating layer 104.

An impurity element imparting p-type conductivity such as boron, aluminum, or gallium or an impurity element imparting n-type conductivity such as phosphorus or arsenic may be added to the semiconductor layer 140 in order to control the threshold voltage of transistors. A region to which the impurity element is added and the kind of the impurity element to be added can be changed as appropriate. For example, an impurity element imparting p-type conductivity can be added in the case of formation of an n-channel transistor and an impurity element imparting n-type conductivity can be added in the case of formation of a p-channel transistor.

Figure 4B:
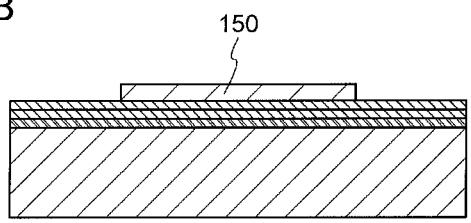

Etching treatment is performed on the semiconductor layer 140, so that the semiconductor layer 140 is separated into an island shape to form an island-shaped semiconductor layer 150 (see FIG. 4B). Note that the etching treatment may be either a wet etching process or a dry etching process.

Figure 4C:
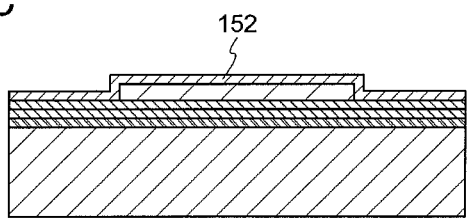

Next, the gate insulating layer 152 is formed so as to cover the semiconductor layer 150 (see FIG. 4C). The gate insulating layer 152 can be formed using one or more materials selected from silicon oxide, silicon nitride, silicon oxynitride, silicon nitride oxide, aluminum oxide, aluminum nitride, aluminum oxynitride, aluminum nitride oxide, hafnium oxide, tantalum oxide, and the like. A method for manufacturing the gate insulating layer 152 is not particularly limited to a certain method, and for example, a sputtering method, a plasma-enhanced CVD method, or the like can be used. The gate insulating layer 152 may be formed by an oxidation or nitridation method by high-density plasma treatment, a thermal oxidation method, or the like. Here, the gate insulating layer 152 is formed using silicon oxide by a plasma-enhanced CVD method.

Figure 4D:
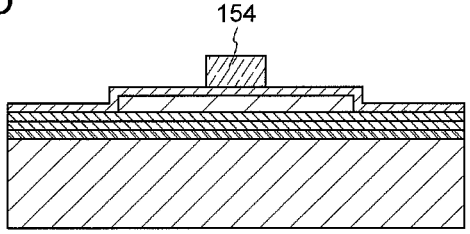

Next, a conductive layer is formed over the gate insulating layer 152, and then the conductive layer is processed (patterned) into a predetermined shape, whereby the gate electrode 154 is formed over the semiconductor layer 150 (see FIG. 4D). The conductive layer can be formed by a CVD method, a sputtering method, or the like. The conductive layer can be formed using a metal such as tantalum, tungsten, titanium, molybdenum, aluminum, copper, chromium, or niobium. Moreover, an alloy containing the metal as its main component or a compound containing the metal may be used. Alternatively, silicon to which an impurity element imparting conductivity is added or the like may be used.

Although the gate electrode 154 is formed using a single-layer conductive layer in this embodiment, a semiconductor device of one embodiment of the disclosed present invention is not limited thereto. In the case where the gate electrode 154 has a two-layer structure, for example, a molybdenum film, a titanium film, a titanium nitride film, or the like may be used as a lower layer, and an aluminum film or the like may be used as an upper layer. In the case of a three-layer structure, a stacked structure of a molybdenum film, an aluminum film, and a molybdenum film; a stacked structure of a titanium film, an aluminum film, and a titanium film; or the like may be employed. Alternatively, a stacked structure of four layers or more may be used.

Next, with the use of the gate electrode 154 as a mask, an impurity element imparting one conductivity type is added to the semiconductor layer 150. Accordingly, a low concentration impurity region 156 and a low concentration impurity region 158 are formed (see FIG. 5A). Here, an impurity element is added so that the impurity concentration in each of the low concentration impurity region 156 and the low concentration impurity region 158 is set to about $5\times10^{16}$ to $1\times10^{18}$ atoms/cm$^3$. Note that in this embodiment, the case where an impurity element imparting n-type conductivity (for example, phosphorus, arsenic, or the like) is added to the semiconductor layer 150 is described; however, one embodiment of the present invention disclosed herein is not limited thereto. An impurity element imparting p-type conductivity (for example, boron or the like) may be added to the semiconductor layer 150. Note that in the case where an impurity element imparting p-type conductivity is added, the appropriate range of the impurity concentration is different from that in the case where an impurity element imparting n-type conductivity is added in some cases.

Figure 5A:
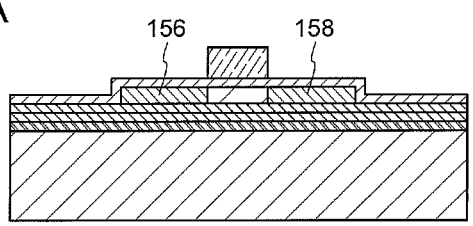
FIGS. 5A to 5D are views illustrating a method for manufacturing a semiconductor device.
Figure 5B:
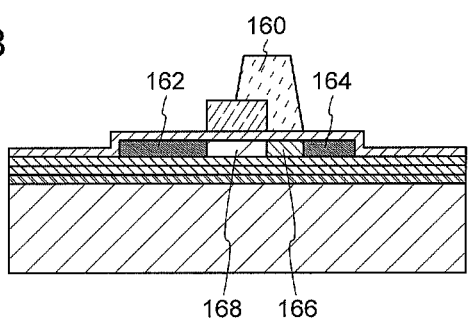

Next, a mask 160 is formed so as to overlap with part of the low concentration impurity region 158 (see FIG. 5B). The mask 160 can be formed in such a way that a resist material is exposed and developed using a photomask, for example. Here, the mask 160 is formed so as to overlap with at least a region of the low concentration impurity region 158, which is adjacent to the semiconductor layer below the gate electrode 154.

Then, with the use of the gate electrode 154 and the mask 160 as a mask, an impurity element imparting one conductivity type is added to the semiconductor layer. Accordingly, while the high concentration impurity region 162 and the high concentration impurity region 164 are formed, the low concentration impurity region 166 and the channel formation region 168 are formed (see FIG. 5B). Here, an impurity element is added so that the impurity concentration in each of the high concentration impurity region 162 and the high concentration impurity region 164 is set to about $1\times10^{19}$ to $1\times10^{21}$ atoms/cm$^3$. Note that the low concentration impurity region 166 is adjacent to the channel formation region 168 and the high concentration impurity region 164 in this embodiment. After the step, the mask 160 is removed.

Figure 5C:
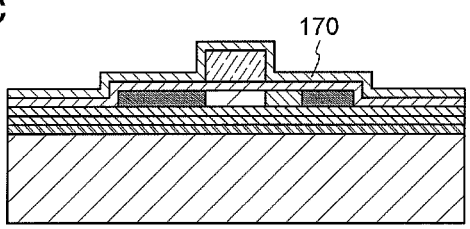
Figure 5D:
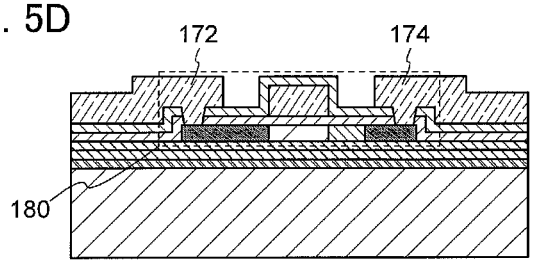

Next, an insulating layer 170 is formed so as to cover the semiconductor layer 150, the gate insulating layer 152, the gate electrode 154, and the like (see FIG. 5C). For example, the insulating layer 170 can be formed using a material such as silicon oxide, silicon nitride, silicon oxynitride, silicon nitride oxide, aluminum nitride, or aluminum oxide. Alternatively, the insulating layer 170 may be formed using an organic material having heat resistance such as polyimide, acrylic, benzocyclobutene, polyamide, or epoxy. Note that the insulating layer 170 is not an essential component; therefore, the insulating layer 170 is not necessarily provided if there is no particular need for it.

Next, the gate insulating layer 152 and the insulating layer 170 are selectively etched, so that contact holes which reach the high concentration impurity region 162 and the high concentration impurity region 164 are formed. Then, through the contact holes, the electrode 172 which is electrically connected to the high concentration impurity region 162 in the semiconductor layer 150 and the electrode 174 which is electrically connected to the high concentration impurity region 164 in the semiconductor layer 150 are formed (see FIG. 5D). Note that when the contact holes are formed, either a wet etching process or a dry etching process may be used.

The electrode 172 and the electrode 174 can be formed in such a manner that a conductive layer formed by a sputtering method, a vacuum evaporation method, or the like is selectively etched, for example. Each of the electrode 172 and the electrode 174 can be formed using a material such as aluminum, tungsten, titanium, tantalum, molybdenum, nickel, platinum, copper, gold, silver, manganese, neodymium, carbon, or silicon; or an alloy or compound which contains any of these materials as its main component. Note that each of the electrode 172 and the electrode 174 may have a single-layer structure or a stacked structure.

As an example of an alloy used for the electrode 172 and the electrode 174, an alloy containing aluminum as its main component and containing nickel can be given. In addition, an alloy containing aluminum as its main component and also containing nickel and either one of or both carbon and silicon can be given as an example. Since aluminum and aluminum silicon (Al—Si) have low resistance and are inexpensive, aluminum and aluminum silicon are suitable as a material for forming the electrode 172 and the electrode 174. In particular, aluminum silicon is preferable because generation of a hillock can be suppressed. Further, a material in which Cu is mixed into aluminum at approximately 0.5% may be used instead of silicon.

In the case where each of the electrode 172 and the electrode 174 is formed to have a stacked structure, a stacked structure of a barrier film, an aluminum silicon film, and a barrier film; a stacked structure of a barrier film, an aluminum silicon film, a titanium nitride film, and a barrier film; or the like may be used, for example. Note that the barrier film refers to a film formed using titanium, nitride of titanium, molybdenum, nitride of molybdenum, or the like. When barrier films are formed to sandwich an aluminum silicon film, generation of a hillock can be further suppressed. Moreover, by forming the barrier film including titanium, which is a highly reducible element, even if a thin oxide film is formed on the surface of the semiconductor layer 150 or the like, the oxide film is reduced by titanium contained in the barrier film, whereby favorable contact between the semiconductor layer and the electrodes can be obtained.

Accordingly, a semiconductor device including the transistor 180 which is used for high voltage and a large amount of current can be manufactured.

As disclosed in this embodiment, the conductive layer is provided below the semiconductor layer, so that the impurity concentration in the low concentration impurity region is not decreased, the electric field in the low concentration impurity region can be reduced, and the drain withstand voltage can be improved. That is, a semiconductor device in which the drain withstand voltage is improved while the on-state current is obtained can be provided.

(Embodiment 2)

In this embodiment, another example of a method for manufacturing a semiconductor substrate which can be used for a semiconductor device will be described. Note that the method for manufacturing a semiconductor substrate in this embodiment and the method for manufacturing a semiconductor substrate in the aforementioned embodiment, which is described with reference to FIGS. 3A to 3F, have a lot in common. Therefore, only different points from the aforementioned embodiment will be mainly described with reference to FIGS. 6A to 6F in this embodiment.

First, the base substrate 100 is prepared (see FIG. 6A). The aforementioned embodiment can be referred to for a detailed description of the base substrate 100. The insulating layer 104 is formed over the base substrate 100 (see FIG. 6A). The aforementioned embodiment can be referred to for a detailed description of the insulating layer 104.

Next, the bond substrate 110 is prepared (see FIG. 6B). The aforementioned embodiment can be referred to for a detailed description of the bond substrate 110.

The bond substrate 110 is irradiated with ions, so that the embrittlement region 112 is formed (see FIG. 6B). The aforementioned embodiment can be referred to for a detailed description of the embrittlement region 112.

Note that before an ion addition step, an insulating layer which functions as a protective insulating layer may be formed on the surface of the bond substrate 110. Needless to say, it is also possible that the insulating layer is not provided; however, the insulating layer is preferably provided in order to prevent contamination and surface damage of the bond substrate 110 due to later ion irradiation. The aforementioned embodiment can be referred to for a detailed description of the insulating layer.

An insulating layer 190, a conductive layer 192, and the insulating layer 114 are stacked over the bond substrate 110 (see FIG. 6B). The description regarding the insulating layer 104 in the aforementioned embodiment, and the like may be referred to for manufacturing methods, materials, structures, and the like of the insulating layer 190 and the insulating layer 114. Note that the insulating layer 190 is not a layer which is used for the attachment; therefore, the insulating layer 190 does not necessarily have planarity which is similar to that of the insulating layer 104 and/or the insulating layer 114. In addition, the insulating layer 104 is not necessarily the same as the insulating layer 114. The description regarding the conductive layer 102 of the aforementioned embodiment can be referred to for a detailed description of the conductive layer 192.

Note that in this embodiment, the case where the insulating layer 104 is formed on the base substrate 100 side and the insulating layer 114 is formed on the bond substrate 110 side is described; however, one embodiment of the present invention disclosed herein is not limited thereto. For example, the insulating layer may be provided only on the base substrate 100 side, or the insulating layer may be provided only on the bond substrate 110 side.

The insulating layer 190 is preferably not too thick in order that one embodiment of the present invention disclosed herein is made more effective. This is because the effect due to the conductive layer 192 is reduced when the insulating layer 190 is too thick. Note that the thickness of the insulating layer 190 has a meaning which is similar to the interval between the semiconductor layer to be formed later and the conductive layer 192. For example, the insulating layer is preferably formed so that the interval between the semiconductor layer and the conductive layer 192 be less than or equal to 5 μm.

After that, the base substrate 100 and the bond substrate 110 are attached to each other (see FIG. 6C). The aforementioned embodiment can be referred to for a detailed description of the attachment.

Next, the bond substrate 110 is separated into the semiconductor layer 120 and the semiconductor substrate 122 at the embrittlement region 112 (see FIG. 6D). The aforementioned embodiment can be referred to for a detailed description of the separation of the bond substrate 110.

In the structural body (hereinafter simply referred to as a "semiconductor substrate") formed as described above, defects due to the separation step or the ion addition step exist on the surface of the semiconductor layer 120, and planarity of the surface is impaired. Therefore, treatment for reducing defects of the semiconductor layer 120 or treatment for improving the surface planarity of the semiconductor layer 120 is performed.

In this embodiment, reduction in defects of the semiconductor layer 120 and improvement in planarity can be realized in such a way that the semiconductor layer 120 is irradiated with the laser beam 130 (see FIG. 6E). The aforementioned embodiment can be referred to for a detailed description thereof. In the case where there is no serious problem in the defects and the surface planarity, the laser beam irradiation treatment itself may be omitted.

Accordingly, a semiconductor substrate having the conductive layer 192 below the semiconductor layer 140 can be formed (see FIG. 6F).

In this embodiment, the case where the conductive layer is provided on the bond substrate 110 side instead of providing the conductive layer on the base substrate 100 side is described. In this way, as long as a structure having a conductive layer below the semiconductor layer can be obtained as a final semiconductor substrate, an effect regarding one embodiment of the present invention disclosed herein can be obtained even when a semiconductor substrate formed by any method is used. That is, it can be said that a method for manufacturing the semiconductor substrate is not limited to the method.

Note that this embodiment can be implemented in combination with any of the other embodiments, as appropriate.

(Embodiment 3)

In this embodiment, one example of a semiconductor device different from that of the aforementioned embodiment and a manufacturing method thereof will be described with reference to FIGS. 7A and 7B, FIGS. 8A to 8G and FIGS. 9A to 9D. Specifically, a transistor which is one example of the semiconductor device will be described with reference to FIGS. 7A and 7B. A method for manufacturing a semiconductor substrate used for the semiconductor device will be described with reference to FIGS. 8A to 8G. A method for manufacturing the transistor which is one example of the semiconductor device will be described with reference to FIGS. 9A to 9D. Note that the transistor in this embodiment has many common portions with the transistor described in the aforementioned embodiments. Therefore, only different portions from the aforementioned embodiment will be described in this embodiment with reference to drawings.

Figure 7A:
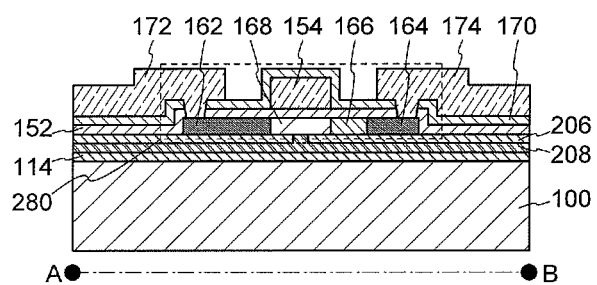
FIGS. 7A and 7B are views illustrating a semiconductor device.
Figure 7B:
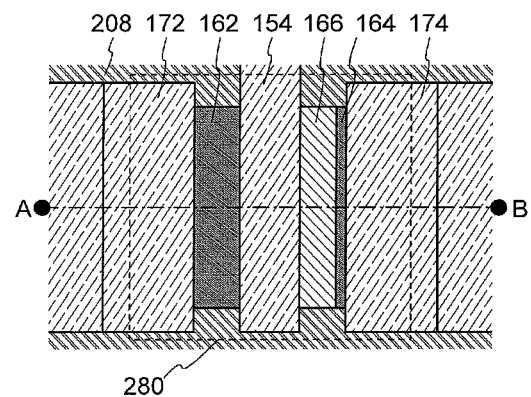

In FIGS. 7A and 7B, a transistor which is one example of the semiconductor device is illustrated. Here FIG. 7A is a cross-sectional view, and FIG. 7B is a plan view. Note that FIG. 7A is a cross-sectional view taken along line A-B of FIG. 7B. In addition, in FIG. 7B, parts of components are omitted for simplicity.

A transistor 280 illustrated in FIGS. 7A and 7B is formed over the base substrate 100 having an insulating surface. Here, between the transistor 280 and the base substrate 100, the insulating layer 114, a conductive layer 208, and an insulating layer 206 are formed in that order from the base substrate 100 side.

The transistor 280 includes the gate electrode 154, the high concentration impurity region 162 (first impurity region), the high concentration impurity region 164 (second impurity region), the low concentration impurity region 166 (third impurity region), the channel formation region 168, the electrode 172, the electrode 174, and the like. The gate electrode 154 has a function of applying voltage to the channel formation region 168 through the gate insulating layer 152. Each of the high concentration impurity region 162, the high concentration impurity region 164, the low concentration impurity region 166, and the channel formation region 168 is formed using a semiconductor material. In terms of element characteristics, it is preferable to use a single crystal semiconductor. In addition, an impurity element imparting one conductivity type is added to the high concentration impurity region 162, the high concentration impurity region 164, and the low concentration impurity region 166. Note that the impurity concentration in the high concentration impurity regions and the low concentration impurity region is set to given impurity concentration; however, it is preferable that, in order to keep the on-state current of the transistor 280 constant, an impurity element be added to the low concentration impurity region 166 at certain concentration.

An impurity element may be added to the channel formation region. For example, an impurity element imparting conductivity different from the conductivity of the high concentration impurity region and the low concentration impurity region can be added. Needless to say, an impurity element imparting the same conductivity as the conductivity of the high concentration impurity region and the low concentration impurity region may be added, if necessary.

The high concentration impurity region 162 (first impurity region) is adjacent to the channel formation region 168. The channel formation region 168 is adjacent to the low concentration impurity region 166. The low concentration impurity region 166 is adjacent to the high concentration impurity region 164. Further, the high concentration impurity region 162 is electrically connected to the electrode 172. The high concentration impurity region 164 is electrically connected to the electrode 174. Here, although the low concentration impurity region may be provided between the channel formation region 168 and the high concentration impurity region 162, in terms of keeping the on-state current, the low concentration impurity region is preferably provided only on the high concentration impurity region (functioning as a drain) side.

Note that although the term "electrode" is used in the above, there is the case where an electrode is part of a wiring, so that a distinction between the electrode and the wiring is for convenience. In this manner, there is the case where an electrode and a wiring indicate the same component, it is not necessary to construe the electrode or the wiring with the limitation of these terms.

The high concentration impurity region 162 functions as a source region of the transistor 280, and the electrode 172 functions as a source electrode of the transistor 280. The high concentration impurity region 164 functions as a drain region of the transistor 280, and the electrode 174 functions as a drain electrode of the transistor 280. The low concentration impurity region 166 between the high concentration impurity region 164 and the channel formation region 168 has a function of reducing the electric field between the high concentration impurity region 164 and the channel formation region 168. In this manner, the transistor 280 is provided with the low concentration impurity region 166, so that the avalanche breakdown caused by impact ionization can be suppressed and the drain withstand voltage can be improved.

Further, the transistor 280 in this embodiment has the conductive layer 208 below the semiconductor layer. Therefore, the electric field in the low concentration impurity region 166 can be favorably reduced.

The conductive layer 208 below the transistor 280 is electrically connected to the channel formation region 168. Therefore, opposite polarity carriers generated by impact ionization can be exhausted through the conductive layer 208. For example, in an n-channel transistor, holes are generated by impact ionization; however, with the use of the structure, the holes can be removed. Therefore, the avalanche breakdown caused by impact ionization can be suppressed and the drain withstand voltage of the transistor can be further improved.

As described above, when the conductive layer 208 is provided below the semiconductor layer, the concentration of the electric field can be reduced, and the drain withstand voltage caused by the opposite polarity carriers can be prevented from decreasing. Therefore, the drain withstand voltage of the transistor 280 can be further improved.

Note that when the impurity concentration in the low concentration impurity region is low (for example, when the impurity concentration is less than $1 \times 10^{16}$ atoms/cm$^3$), a region having a relatively low conductive property is formed between the channel formation region and the high concentration impurity region; therefore, the concentration of the electric field can be reduced even when the conductive layer is not formed. However, when the impurity concentration in the low concentration impurity region is thus low, the resistance at the time when the transistor is operated increases, so that the on-state current decreases.

In one embodiment of the present invention disclosed in this specification and the like, the conductive layer 208 which is electrically connected to the semiconductor layer is provided below the semiconductor layer, so that the drain withstand voltage can be improved without decreasing the impurity concentration in the low concentration impurity region. In addition, the problem caused by the opposite polarity carriers can be suppressed. That is, the object in which the on-state current is compatible with the drain withstand voltage when a substrate having an insulating surface is used as a base substrate can be achieved, and the object in which the decrease in the drain withstand voltage of the transistor is suppressed can be achieved. Note that to suppress the decrease in the on-state current, the impurity concentration in the low concentration impurity region may be set to higher than or equal to $5 \times 10^{16}$ atoms/cm$^3$, for example.

Next, a method for manufacturing a semiconductor substrate used for a semiconductor device will described with reference to FIGS. 8A to 8G Specifically, the method for processing the bond substrate 110 will be described in detail.

Figure 8A:
FIGS. 8A to 8G are views illustrating a method for manufacturing a semiconductor substrate.

First, the bond substrate 110 is prepared (see FIG. 8A). The aforementioned embodiment can be referred to for a detailed description of the bond substrate 110.

Figure 8B:

Next, addition (irradiation) of ions to the bond substrate 110 is performed, whereby the embrittlement region 112 is formed (see FIG. 8B). The aforementioned embodiment can be referred to for a detailed description of the embrittlement region 112.

Note that before the ion addition step, an insulating layer which functions as a protective insulating layer may be formed on the surface of the bond substrate 110. Needless to say, it is also possible that the insulating layer is not provided; however, the insulating layer is preferably provided in order to prevent contamination and surface damage of the bond substrate 110 due to later ion irradiation. The aforementioned embodiment may be referred to for a detailed description of the insulating layer.

Figure 8C:

After the embrittlement region 112 is formed, a conductive layer 200 is formed on the surface of the bond substrate 110 (see FIG. 8C). Note that the conductive layer 200 can be formed by a sputtering method, a vacuum evaporation method, or the like. The description on the conductive layer 102 in the aforementioned embodiment may be referred to for a detailed description of the conductive layer 200.

Figure 8D:
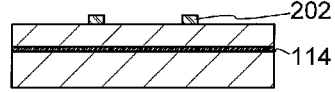

Then, the conductive layer 200 is processed (patterned) into a predetermined shape, thereby forming a conductive layer 202 (see FIG. 8D).

Figure 8E:
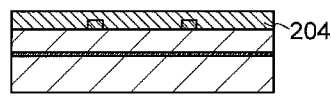

Then, an insulating layer 204 is formed so as to cover the conductive layer 202 (see FIG. 8E). The insulating layer 204 can be formed in a manner similar to that of the insulating layer 104 in the aforementioned embodiment.

Figure 8F:
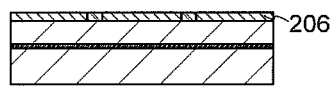

Then, the insulating layer 206 is formed by partly removing the insulating layer 204 (see FIG. 8F). Because a layer to be bonded later is formed over the insulating layer 206, planarization treatment is preferably performed. As another example of the planarization treatment, etching treatment (etch-back treatment) can be given. The etching treatment may be performed by dry etching, wet etching, or a combination of the both etchings. In addition to the etching treatment, planarization treatment by polishing (CMP or the like) may also be performed. Needless to say, only polishing may be performed as well.

Note that in this embodiment, the structure in which the surface of the conductive layer 202 and the surface of the insulating layer 206 exist on the same plane is described. This is because a conductive layer to be formed later and a semiconductor layer can be electrically connected to each other with the conductive layer 202. Accordingly, as long as the conductive layer 202 can have that function, interpretation is not necessarily limited to the structure.

Figure 8G:
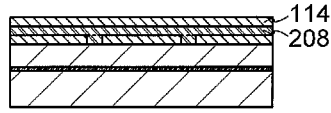

Next, the conductive layer 208 and the insulating layer 114 are formed over the conductive layer 202 and the insulating layer 206 (see FIG. 8G). The conductive layer 208 can be formed in a manner similar to that of the conductive layer 200. The aforementioned embodiment can be referred to for a detailed description of the insulating layer 114.

Accordingly, the bond substrate 110 can be processed into a shape used to manufacture a semiconductor substrate.

The aforementioned embodiment (for example, description regarding FIGS. 3A to 3F and FIGS. 6A to 6F) can be referred to for a process for manufacturing a semiconductor substrate by attachment of the base substrate and the bond substrate and separation.

Next, a method for manufacturing a semiconductor device will be described with reference to FIGS. 9A to 9D.

Figure 9A:
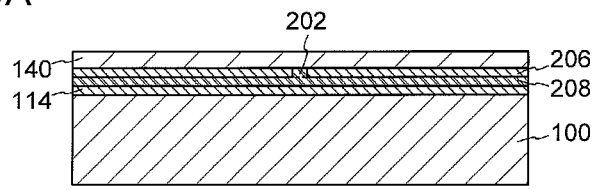
FIGS. 9A to 9D are views illustrating a method for manufacturing a semiconductor device.

FIG. 9A corresponds to an enlarged cross-sectional view of part of a semiconductor substrate which is manufactured using the bond substrate obtained through the processing process. As can be seen from FIG. 9A, the conductive layer 208 exists below the semiconductor layer 140, and the conductive layer 208 and the semiconductor layer 140 are electrically connected to each other through the conductive layer 202. Note that the semiconductor substrate illustrated in FIG. 9A is not provided with the insulating layer 104 on the base substrate 100 side; however, one embodiment of the present invention disclosed herein is not limited thereto.

An impurity element imparting p-type conductivity such as boron, aluminum, or gallium or an impurity element imparting n-type conductivity such as phosphorus or arsenic may be added to the semiconductor layer 140 in order to control the threshold voltage of a transistor. A region to which the impurity element is added and the kind of the impurity element to be added can be changed as appropriate. For example, an impurity element imparting p-type conductivity is added in the case of formation of an n-channel transistor and an impurity element imparting n-type conductivity is added in the case of formation of a p-channel transistor.

Etching treatment is performed on the semiconductor layer 140, and the semiconductor layer 140 is separated into an island shape to form the island-shaped semiconductor layer 150. Note that the etching treatment may be a wet etching process or a dry etching process. Then, the gate insulating layer 152 is formed so as to cover the semiconductor layer 150. The aforementioned embodiment can be referred to for a detailed description of the gate insulating layer 152.

Figure 9B:
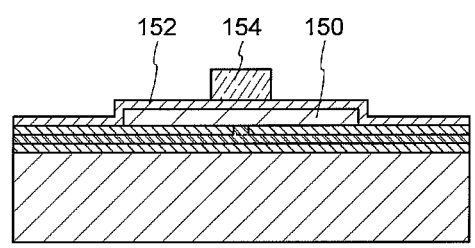

Next, a conductive layer is formed over the gate insulating layer 152, and then the conductive layer is processed (patterned) into a predetermined shape, whereby the gate electrode 154 is formed over the semiconductor layer 150 (see FIG. 9B). The aforementioned embodiment can be referred to for a detailed description of the gate electrode 154.

Next, the gate electrode 154 is used as a mask, and an impurity element imparting one conductivity type is added to the semiconductor layer 150 to form a low concentration impurity region. Then, a mask is formed so as to overlap with part of the low concentration impurity region, and then an impurity element imparting one conductivity type is added to the semiconductor layer, using the mask. Accordingly, the high concentration impurity region 162 and the high concentration impurity region 164 are formed, and the low concentration impurity region 166 and the channel formation region 168 are formed.

Figure 9C:
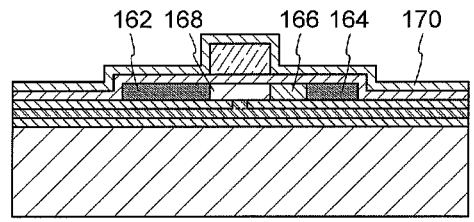
Figure 9D:
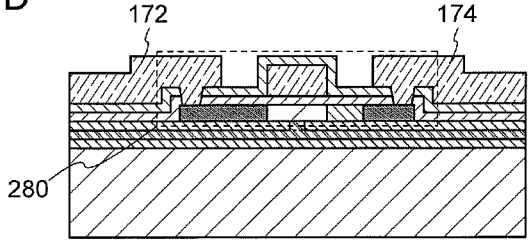

Next, the insulating layer 170 is formed so as to cover the semiconductor layer 150, the gate insulating layer 152, the gate electrode 154, and the like (see FIG. 9C). The aforementioned embodiment can be referred to for a description of the insulating layer 170.

Next, the gate insulating layer 152 and the insulating layer 170 are selectively etched to form contact holes which reach the high concentration impurity region 162 and the high concentration impurity region 164. Then, through the contact holes, the electrode 172 which is electrically connected to the high concentration impurity region 162 in the semiconductor layer 150 and the electrode 174 which is electrically connected to the high concentration impurity region 164 in the semiconductor layer 150 are formed (see FIG. 9D). Note that when the contact holes are formed, either a wet etching process or a dry etching process may be used. The aforementioned embodiment can be referred to for a detailed description of the electrode 172 and the electrode 174.

Accordingly, a semiconductor device including the transistor 280 which is used for high voltage and a large amount of current can be manufactured.

As described in this embodiment, when the conductive layer which is electrically connected to the semiconductor layer is provided below the semiconductor layer, the electric field in the low concentration impurity region can be reduced, and the avalanche breakdown caused by the opposite polarity carriers can be suppressed, so that the drain withstand voltage can be further improved.

Note that this embodiment can be implemented in combination with any of the other embodiments, as appropriate.

This application is based on Japanese Patent Application serial No. 2009-059157 filed with Japan Patent Office on Mar. 12, 2009, the entire contents of which are hereby incorporated by reference.

What is claimed is:

1. A method for manufacturing a semiconductor device, comprising the steps of:
    irradiating a bond substrate with an ion to form an embrittlement region in the bond substrate;
    forming a first insulating layer over the bond substrate;
    forming a conductive layer over the first insulating layer;
    forming a second insulating layer over the conductive layer;
    forming a third insulating layer over a base substrate;
    attaching the second insulating layer to the third insulating layer;
    heating the bond substrate and separating the bond substrate in the embrittlement region to form a stacked structure of the third insulating layer, the second insulating layer, the conductive layer, the first insulating layer, and a semiconductor layer over the base substrate;
    patterning the semiconductor layer to form an island-shaped semiconductor layer;
    forming a gate insulating layer over the island-shaped semiconductor layer;
    forming a gate electrode over the gate insulating layer;
    forming a first impurity region, a second impurity region, and a third impurity region; and
    forming a first electrode electrically connected to the first impurity region and a second electrode electrically connected to the second impurity region,
    wherein the third impurity region is provided between a channel formation region and the second impurity region,
    wherein the conductive layer is configured to reduce an electric field at a periphery of a bonding region when a voltage is applied between the first impurity region and the second impurity region, and
    wherein the bonding region is a region where the channel formation region and the second impurity region are bonded to each other.

2. The method for manufacturing a semiconductor device, according to claim 1, wherein the ion-irradiating step is performed before the step of forming the first insulating layer, after the step of forming the first insulating layer, after the step of forming the conductive layer, or after the step of forming the second insulating layer.

3. The method for manufacturing a semiconductor device, according to claim 1, further comprising the step of forming a protective insulating layer over the bond substrate,
    wherein adding the ion to the bond substrate is performed through the protective insulating layer.

4. The method for manufacturing a semiconductor device, according to claim 1, wherein an impurity concentration in the third impurity region is lower than that of the second impurity region.

5. The method for manufacturing a semiconductor device, according to claim 1, wherein an impurity concentration of each of the first impurity region and the second impurity region is higher than or equal to $1\times10^{19}$ atoms/cm$^3$, and wherein an impurity concentration of the third impurity region is higher than or equal to $5\times10^{16}$ atoms/cm$^3$.

6. The method for manufacturing a semiconductor device, according to claim 1, wherein the bond substrate is a single crystal silicon substrate or a single crystal silicon carbide substrate.

7. A method for manufacturing a semiconductor device, comprising the steps of:
    irradiating a bond substrate with an ion to form an embrittlement region in the bond substrate;
    forming a first insulating layer over the bond substrate;
    forming a conductive layer over the first insulating layer;
    forming a second insulating layer over the conductive layer;
    forming a third insulating layer over a base substrate;
    attaching the second insulating layer to the third insulating layer;
    heating the bond substrate and separating the bond substrate in the embrittlement region to form a stacked structure of the third insulating layer, the second insulating layer, the conductive layer, the first insulating layer, and a semiconductor layer over the base substrate;
    patterning the semiconductor layer to form an island-shaped semiconductor layer;
    forming a gate insulating layer over the island-shaped semiconductor layer;
    forming a gate electrode over the gate insulating layer; and
    forming a first impurity region, a second impurity region, and a third impurity region;
    wherein the third impurity region is provided between a channel formation region and the second impurity region,
    wherein the conductive layer is configured to reduce an electric field at a periphery of a bonding region when a voltage is applied between the first impurity region and the second impurity region, and
    wherein the bonding region is a region where the channel formation region and the second impurity region are bonded to each other.

8. The method for manufacturing a semiconductor device, according to claim 7, wherein the ion-irradiating step is performed before the step of forming the first insulating layer, after the step of forming the first insulating layer, after the step of forming the conductive layer, or after the step of forming the second insulating layer.

9. The method for manufacturing a semiconductor device, according to claim 7, further comprising the step of forming a protective insulating layer over the bond substrate,
    wherein adding the ion to the bond substrate is performed through the protective insulating layer.

10. The method for manufacturing a semiconductor device, according to claim 7, wherein an impurity concentration in the third impurity region is lower than that of the second impurity region.

11. The method for manufacturing a semiconductor device, according to claim 7,
    wherein an impurity concentration of each of the first impurity region and the second impurity region is higher than or equal to $1\times10^{19}$ atoms/cm$^3$, and
    wherein an impurity concentration of the third impurity region is higher than or equal to $5\times10^{16}$ atoms/cm$^3$.

12. The method for manufacturing a semiconductor device, according to claim 7, wherein the bond substrate is a single crystal silicon substrate or a single crystal silicon carbide substrate.

13. A method for manufacturing a semiconductor device, comprising the steps of:
    irradiating a bond substrate with an ion to form an embrittlement region in the bond substrate;
    forming a first insulating layer over the bond substrate;
    forming a conductive layer over the first insulating layer;
    forming a second insulating layer over the conductive layer;
    forming a third insulating layer over a base substrate;
    attaching the second insulating layer to the third insulating layer;
    heating the bond substrate and separating the bond substrate in the embrittlement region to form a stacked structure of the third insulating layer, the second insulating layer, the conductive layer, the first insulating layer, and a semiconductor layer over the base substrate;
    patterning the semiconductor layer to form an island-shaped semiconductor layer;
    forming a gate insulating layer over the island-shaped semiconductor layer;
    forming a gate electrode over the gate insulating layer;
    forming a first impurity region, a second impurity region, and a third impurity region;
    forming a fourth insulating layer over the gate electrode; and
    selectively etching the gate insulating layer and the fourth insulating layer,
    wherein the third impurity region is provided between a channel formation region and the second impurity region,
    wherein the conductive layer is configured to reduce an electric field at a periphery of a bonding region when a voltage is applied between the first impurity region and the second impurity region, and
    wherein the bonding region is a region where the channel formation region and the second impurity region are bonded to each other.

14. The method for manufacturing a semiconductor device, according to claim 13, wherein the ion-irradiating step is performed before the step of forming the first insulating layer, after the step of forming the first insulating layer, after the step of forming the conductive layer, or after the step of forming the second insulating layer.

15. The method for manufacturing a semiconductor device, according to claim 13, further comprising the step of forming a protective insulating layer over the bond substrate,
    wherein adding the ion to the bond substrate is performed through the protective insulating layer.

16. The method for manufacturing a semiconductor device, according to claim 13, wherein an impurity concentration in the third impurity region is lower than that of the second impurity region.

17. The method for manufacturing a semiconductor device, according to claim 13,
    wherein an impurity concentration of each of the first impurity region and the second impurity region is higher than or equal to $1\times10^{19}$ atoms/cm$^3$, and
    wherein an impurity concentration of the third impurity region is higher than or equal to $5\times10^{16}$ atoms/cm$^3$.

18. The method for manufacturing a semiconductor device, according to claim 13, wherein the bond substrate is a single crystal silicon substrate or a single crystal silicon carbide substrate.

* * * * *